US005745333A

United States Patent [19]
Frankeny et al.

[11] Patent Number: 5,745,333
[45] Date of Patent: Apr. 28, 1998

[54] LAMINAR STACKABLE CIRCUIT BOARD STRUCTURE WITH CAPACITOR

[75] Inventors: Jerome Albert Frankeny, Taylor; Richard Francis Frankeny, Austin; Terry Frederick Hayden, Round Rock; Ronald Lann Imken, Round Rock; Janet Louise Rice, Round Rock, all of Tex.

[73] Assignee: International Business Machines Corporation, Armonk, N.Y.

[21] Appl. No.: 342,507

[22] Filed: Nov. 21, 1994

[51] Int. Cl.$^6$ .................................. H01G 4/06
[52] U.S. Cl. .................. 361/313; 361/301.4; 361/302; 361/306.1; 361/761; 361/762; 361/763; 361/782
[58] Field of Search .................. 361/311, 312, 361/313, 305, 310, 321.1–321.5, 523, 524, 301.1, 301.4, 302, 306.1, 306.3, 308.1, 761, 762, 763, 782; 174/255, 260

[56] References Cited

U.S. PATENT DOCUMENTS

| Re. 35,064 | 10/1995 | Hernandez | 361/763 |
| 5,079,069 | 1/1992 | Howard et al. | 361/763 |
| 5,099,309 | 3/1992 | Kryzaniwsky | 361/718 |
| 5,162,977 | 11/1992 | Paurus et al. | 361/762 |

FOREIGN PATENT DOCUMENTS

| 0014993 | 1/1989 | Japan | 174/255 |

Primary Examiner—Leo P. Picard
Assistant Examiner—Phuong T. Vu
Attorney, Agent, or Firm—Casimer K. Salys

[57] ABSTRACT

Method and apparatus for fabricating fine pitch pattern multilayer printed circuit boards involving laminar stackable board layers providing power distribution, signal distribution and capacitive decoupling. In one respect, the invention relates to the fabrication of board layers by beginning with a metallic core, patterning the core, selectively enclosing the core in a dielectric, selectively depositing metal to form vias, plugs and signal lines, and forming dendrites with joining metallurgy on the vias and plugs to provide stackable connection from above or below the plane of the board layer. In another aspect, the invention is directed to the use of a sol-gel process to form a thin high dielectric constant crystalline film onto a metallic sheet followed with a deposition of a metallic layer onto the high dielectric constant film. The film serves as the dielectric of a capacitor layer which is thereafter in succession patterned, covered by a dielectric, and has selectively deposited a metallic layer for interconnecting the capacitor and forming vias. The ends of the vias are thereafter subject to dendritic growth and joining metallurgy to provide stackable interconnection capability. A multilayer composite laminar stackable circuit board structure is created using, as appropriate, layers having metallic cores and layers having capacitively configured cores. The multilayer laminar stackable circuit board provides direct vertical connection between surface mounted electronic components and the power, signal and capacitive decoupling layers of the composite board through the dendrites and joining metallurgy of the via and plug formations.

17 Claims, 7 Drawing Sheets

(ANNEAL IN O2)

LAMINAR STACKABLE CIRCUIT BOARD STRUCTURE WITH CAPACITOR

BACKGROUND OF THE INVENTION

1. Field of the Invention

The present invention relates generally to electronic circuit board structures. More specifically, the invention is directed to the manufacture and use of circuit boards which integrate capacitive structures and are conveniently laminated through stacked interconnection. The invention has two facets, first that relating to the efficient manufacture and use of the circuit boards, and second that relating to the efficient manufacture and use of circuit boards incorporating capacitive structures in conjunction with boards not providing capacitive resources.

2. Description of Related Art

Fine pitch pattern multilayer printed circuit boards are routinely used to interconnect integrated circuit devices in complex electronic apparatus, including but not limited to computer systems. As the pitch of the conventionally used copper patterns in the various layers of the boards decrease, the layer-to-layer interconnection has proven to be more challenging when accomplished through the conventional practice of drilling and plating vias, including the use of blind vias or plugs.

In such multilayer boards, it is common to use planar sheets of copper as ground paths, as power supply paths and as shields between signal line layers. Integrated circuit packages routinely have decoupling capacitors mounted immediately adjacent their power supply leads, on the surface of the printed circuit board, to reduce noise.

The difficulty of manufacturing multilayer printed circuit boards in the fine wiring pitches needed for direct attach of integrated circuit die, such as exists with the flip-chip technology, led to the use of high density circuit boards or substrates as described in U.S. Pat. No. 5,146,674, the subject matter of which is incorporated by reference herein. The technology characterized by this patent involves the formation of individual layers, for a concluding multilayer board design, from electrically conductive planar sheets. Vias and plugs are formed in dielectrically insulated holes through the sheets. Signal lines are patterned in conductive layers deposited on dielectric layers formed over the metallic core sheet. Vertical interconnections are created through patterns of vias and plugs during the mating of successive layers by aligned compression.

Given that vias and plugs serve similar vertical interconnect functions, use of the term "via" hereafter is intended to encompass both forms of structures.

Reliable connection between the vias is accomplished through dendrites formed on the ends of the vias. The dendrites physically contact corresponding dendrites in other layer vias when the aligned layers are compressed. The formation and use of such dendrites is described in U.S. Pat. No. 5,137,461, the subject matter of which is incorporated by reference herein.

Further refinements in the use of such vertically interconnected board structures are described in U.S. Pat. No. 5,363,275, the subject matter of which is also incorporated by reference herein. This patent focuses on the selective lamination of numerous layers to both interconnect high density flip-chip devices as well as to provide the basic flexible cable resource for interconnecting groupings of such layers as may be used with a modularized component computer system.

Fabrication of the laminar stackable circuit boards which comprise the individual layers of the multilayer interconnect systems sought in the aforementioned U.S. Pat. Nos. 5,146,674 and 5,363,275 depend upon the process in U.S. Pat. No. 5,146,674 to create the individual layers. Though viable, the process is unfortunately complex and therefore costly.

As digital system clock rates and the number integrated circuit die I/O lines increase, capacitive decoupling of the power supply at the leads of the integrated circuit die becomes more important. The prior art practice of mounting decoupling capacitors adjacent the integrated circuit packages is not desirable for a number of reasons. First, the use of such capacitors requires extra fabrication operations. In addition, the capacitors are relatively large in relation to contemporary integrated circuit devices. Lastly, since the capacitors are surface mounted devices, the ground and power supply connections must be routed to the surface at the capacitor leads, introducing resistance and inductance in the decoupling path.

Though capacitive structures may be incorporated into the integrated circuit die, the cost in silicon area and magnitude of capacitance obtainable seldom justify that approach.

Therefore, there remains a need for a capacitive structure which can be integrated into multilayer printed circuit boards and preferably involve a fabrication process which follows the basic tenets of the process used to create advanced laminar stackable circuit board configurations.

SUMMARY OF THE INVENTION

In one form, the invention is directed to a circuit board capacitor comprising an electrically conductive first power plane, an electrically conductive second power plane, a thin film first dielectric layer between the first and second power planes, forming a capacitor thereby, a first via extending through the first power plane, the second power plane and the first dielectric layer, electrically connected to the second power plane and electrically insulated from the first power plane by a relatively thick second dielectric layer, and a second via extending through the first power plane, the second power plane and first dielectric layer, electrically connected to the first power plane and electrically insulated from the second power plane by the relatively thick second dielectric layer.

In another form, the invention comprises an electrically conductive first power plane, an electrically conductive second power plane, a thin film compound first dielectric layer between the first and second power planes, forming a capacitor thereby, a first via extending through the first power plane, the second power plane and the first dielectric layer, electrically connected to the second power plane and electrically insulated from the first power plane by a relatively thick second dielectric layer, a second via extending through the first power plane, the second power plane and first dielectric layer, electrically connected to the first power plane, and electrically insulated from the second power plane by the relatively thick second dielectrically layer, an electrically conductive third power plane, a relatively thick dielectric over the conductive third power plane, a third via extending through the third dielectric and either side of the third power plane, electrically connected to a region of the third power plane, a fourth via extending through the third power plane an electrically insulated from the third power plane by relatively thick third dielectric, direct connection between the first and the third or fourth vias, and direct connection between the second and the third or fourth vias. In other forms, the invention is directed to processes from manufacturing the apparatus so defined.

According to one embodiment of the invention, a capacitive structure printed circuit board layer is formed, as an element of a stacked multilayer circuit board, using a thin layer of high dielectric constant sol-gel based crystalline film. Connections to the electrically conductive layers that compose the capacitor's plates are made through vias. The multiple layers of the composite board are stacked for electrical connection through the dendrites at the ends of the vias. The concluding multilayer board has a laminar configuration of capacitor layers, ground planes, power planes and signal lines. The vias are fabricated in the fine pitch patterns surface mount components, such as ball grid array flip-chip devices. The circuit board capacitors decouple the power supply at the pads of the flip-chip die, with minimum resistance and inductance in any connecting lines.

The process used to fabricate the circuit board capacitors, according to one practice of the invention, is a refinement of the new process for forming the circuit board layers which are used to provide power, ground and fine pitch signal lines in a laminar stackable circuit board format.

These and other features of the invention will be more clearly understood and appreciated upon considering the detailed description of the embodiments which follow.

DESCRIPTION OF THE PREFERRED EMBODIMENT

The present invention as preferably embodied has a number of facets. The first relates to the structure and fabrication of a conductive core circuit board layer. The second relates to the structure and efficient fabrication of capacitor core circuit board structures. Lastly, it relates to a laminar stackable multilayer circuit board structure having both signal, power supply, and capacitor layers efficiently integrated into a composite which is suitable for connecting fine pitch surface mount components, such as flip-chip devices or the like. The invention will first be described with reference to the conductive core layer, then with reference to the capacitive core layer, and finally in the context of a stacked multilayer composite circuit board.

Figure 1:
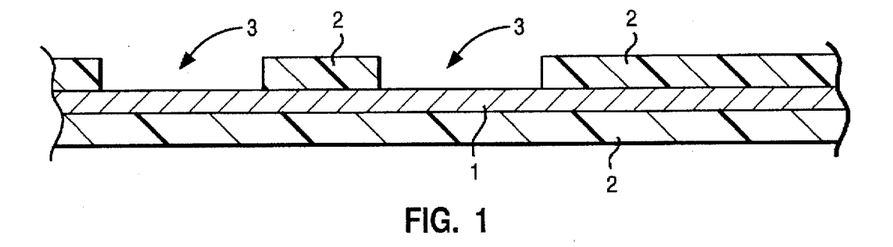
FIGS. 1–10 depict by schematic cross-section various stages during the fabrication of a circuit board layer having a power plane and signal lines.
Figure 2:
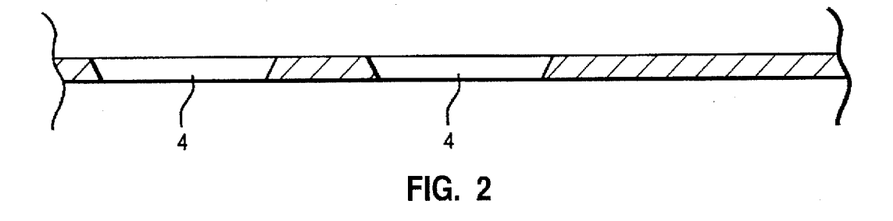
Figure 3:
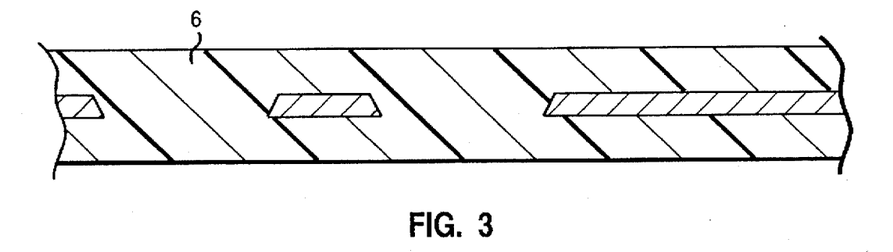

Fabrication begins as shown in FIG. 1 with a core sheet 1 of copper-invar-copper (CIC) approximately 0.025 millimeters thick. Though less desirable, the metallic core could be composed of pure copper, chromium, invar, molybdenum, or copper-molybdenum-copper. The core is covered by a photolithographically patterned mask 2 so as to expose areas 3 to etchants such as cupric chloride and hydrochloric acid. FIG. 2 shows the CIC layer following the etch of areas 3, showing holes 4, preferably circular, extending through the sheet of CIC. The patterned sheet of CIC is then coated on both sides with a relatively thick dielectric 6 of a photoimagable polymer, such as epoxy or polyimide, as shown in FIG. 3.

Figure 4:
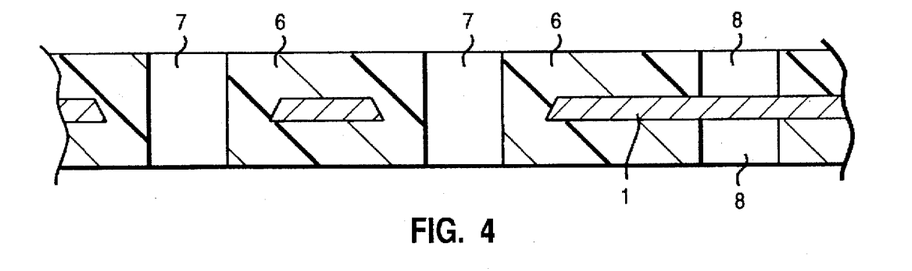
Figure 5:
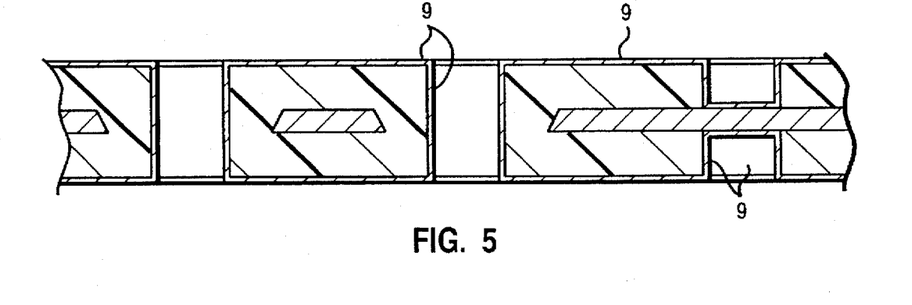

Photolithographic masking and etching of dielectric 6 follows to create holes 7 as shown in FIG. 4. Standard etchants are used. Note that holes 7 are electrically insulated from CIC sheet 1 by walls of dielectric 6 while the etched openings 8 expose CIC sheet 1. An electrically conductive commoning layer 9 of copper is then conformally deposited to a nominal thickness of 0.001 to 0.0025 millimeters meters on all exposed surfaces, as shown generally in FIG. 5. Commoning layer 9 is used to facilitate plating of selected regions during a subsequent operation.

Figure 6:
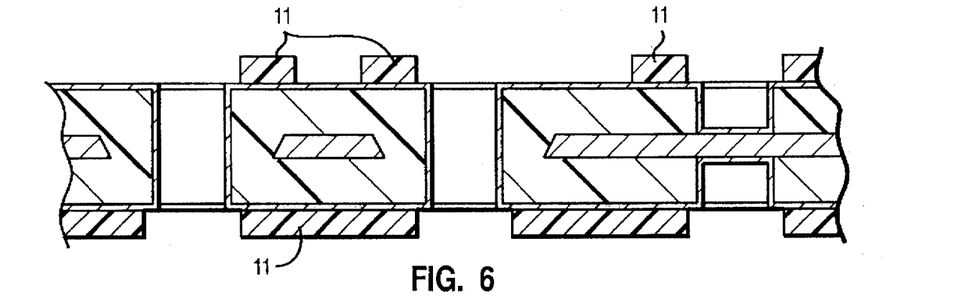
Figure 7:
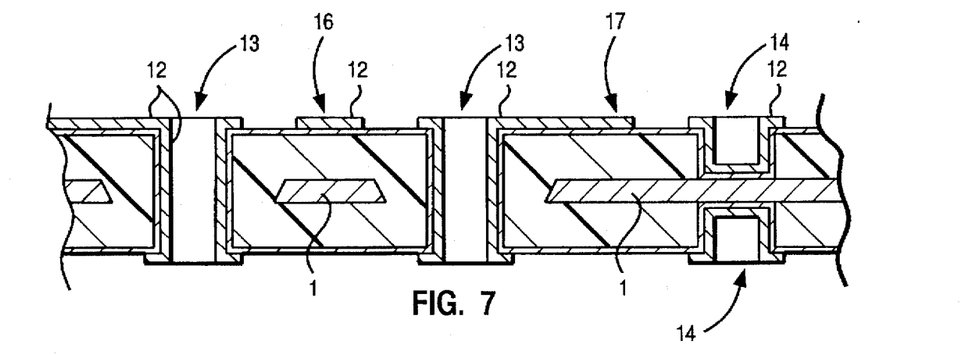

Mask 11 is then photolithographically formed over copper layer 9 to selectively expose those areas which are to be plated, as shown in FIG. 6. Following the plating and stripping of mask 11, the regions not covered by mask 11 have a nominal 0.015 to 0.05 millimeter thick layer 12 of electrically conductive copper deposited, as illustrated in FIG. 7. Note with reference to FIG. 7 that the circuit board layer at this stage in the fabrication process includes relatively thick deposits of copper on the inner walls of holes 13, on the dielectric walls and exposed areas of CIC sheet 1 at openings 14, and as selectively patterned lines on one or more surfaces of the circuit board layer, such as freestanding signal line pattern 16 or extension 17 of hole pattern 13. Such conductive regions define the electrical paths within and between the layers of the laminar stackable circuit board eventually created.

Figure 8:
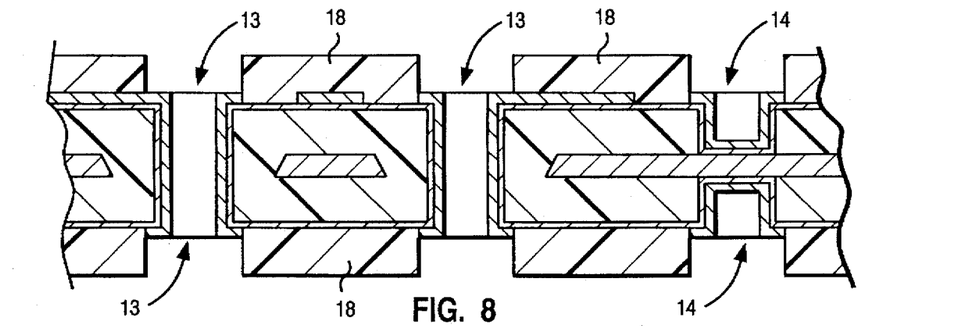
Figure 9:
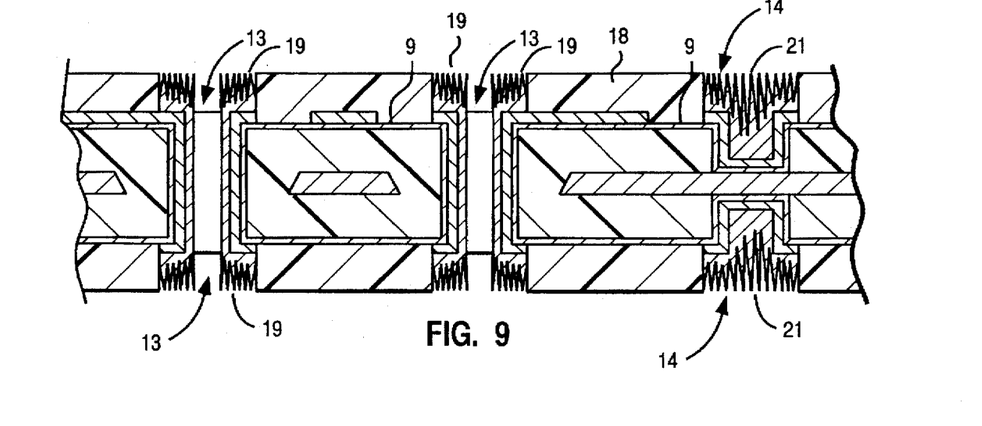

Next, mask 18 is photolithographically patterned to cover all but the ends of the vias defined at 13 and the via like plug structures defined at 14. The purpose of mask 18 is to define regions for selective growth of dendrites as taught in U.S. Pat. No. 5,137,461. FIG. 9 depicts the cross-section of the board layer following the dendritic growth process, whereby dendrites 19 are formed at the opposite ends of the vias at 13 and dendrites 21 extend over both ends of the via-like plugs at 14. Note that dendrite material is also deposited along the inner passages of the vias at 13, though dendrite formation is significantly less pronounced. Plating of the dendritic regions with a joining metallurgy follows, typically using a tin/lead alloy and providing a layer nominally 0.0025 to 0.025 millimeters thick.

Figure 10:
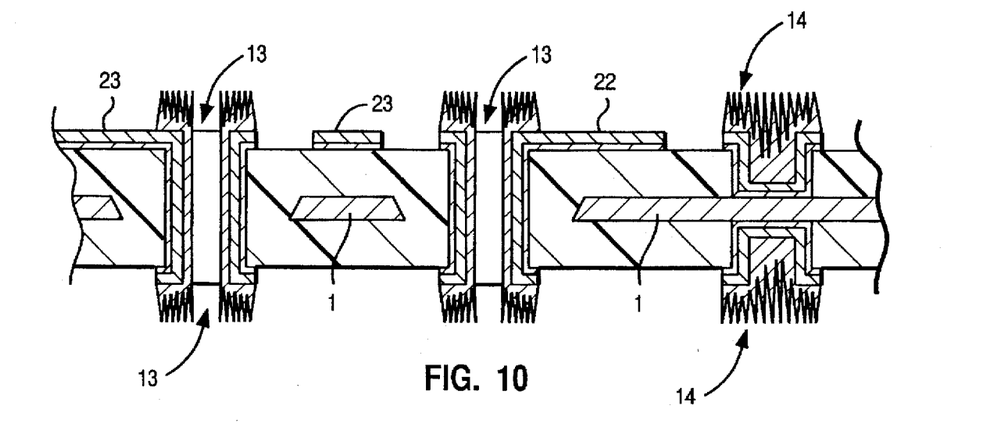

FIG. 10 depicts the cross-section of the layer following the stripping of mask 18 and etched removal of exposed copper commoning layer 9. FIG. 10 represents a completed layer of the stackable laminar circuit board structure. As shown in this figure, the layer includes a conductive inner core 1 suitable to supply power or ground potential through the dendritically terminated plugs at 14 from above or below the respective dendrites. Also present in the layer structure are the vias at 13, which vias likewise are available for dendritic connection from above or below the layer. Note that the vias are electrically isolated from electronically conductive core sheet 1. However, one of the vias is connected to conductor 22 on the upper surfaces of the board layer. Thereby, surface conductors such as 22, are interconnected from above or below the board layer through the dendritic termination of the vias at 13. The board layer in FIG. 10 also shows an electrically isolated conductive line 23 on the upper surface of the board. Surface conductor 23 illustrates that signal lines on the surface of the board layer can be patterned electrically distinct from the vias at 13 and plug structures at 14.

Figure 11:
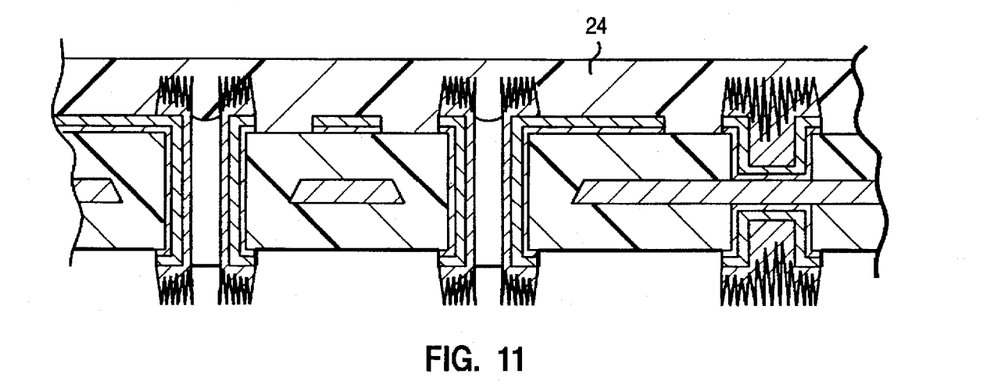
FIGS. 11 and 12 depict by schematic cross-section the preparation and laminar connection of two power plane circuit board layers.
Figure 12:
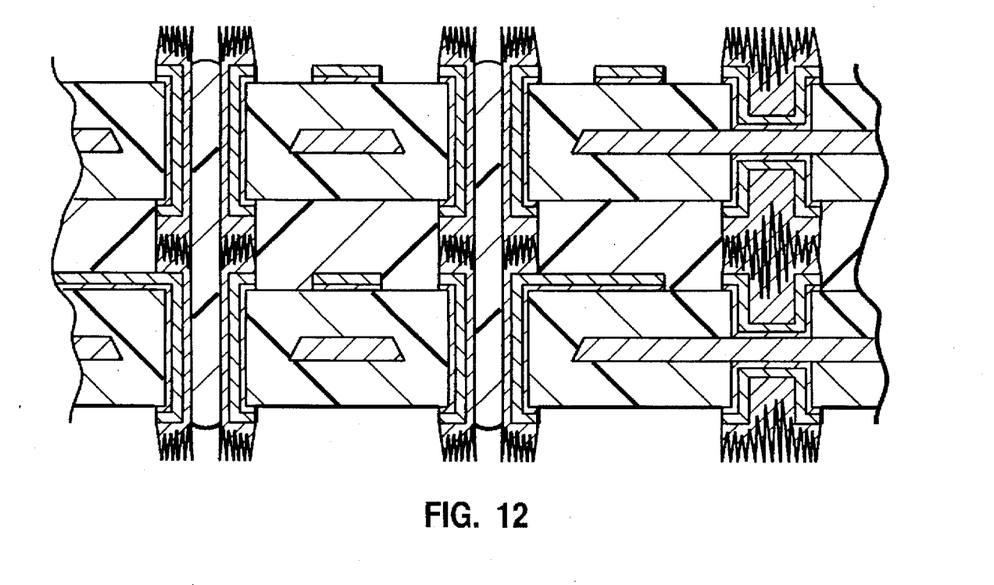

FIGS. 11 and 12 depict the use of the stackable circuit board layer in FIG. 10 to create a multiple layer circuit board. In FIG. 11, the board layer is shown coated with a viscous dielectric 24. Thereafter, a second board layer, typically having a different surface conductor pattern, is aligned and mated under pressure and heat to form, as depicted in FIG. 12, a two layer stacked circuit board structure. The use of heat during the lamination step reflows the joining metallurgy on the via dendrites to form a high integrity electrical connection. The stacked structure provides a direct connection between the respective core conductors through the plug structures and direct connection of the vias and associated signal lines. The dendrites ensure reliable electrical connection while the viscous dielectric seals the boundary and binds the two stackable layers.

The second aspect of the invention relates to the formation of capacitive elements into the fundamental core structures of stackable circuit board layers. What makes the board capacitor structures of the present invention particularly valuable is (1) the exceptional size of the capacitance, attributable to the use of thin film high dielectric constant materials, (2) the optimized electrical characteristics of the connections between the capacitor structures and surface mounted electronic devices, (3) the similarity of the fabrication processes used to form capacitor structures and to those used to fabricate other stackable board layers and (4) the ease with which multiple capacitive board layers can be connected with signal and power stackable board layers. The capacitor structure stackable board layers provide high capacitance, low resistance, low inductance structures which can be used in conjunction with the dendritically interconnected laminar stackable multilayer board described with reference to FIG. 12. The decoupling effect of the capacitive regions is particularly pronounced in that the capacitance is distributed, as defined by the array of vias, and is separated from the device leads by no more than the board layers along the via paths.

Figure 13:
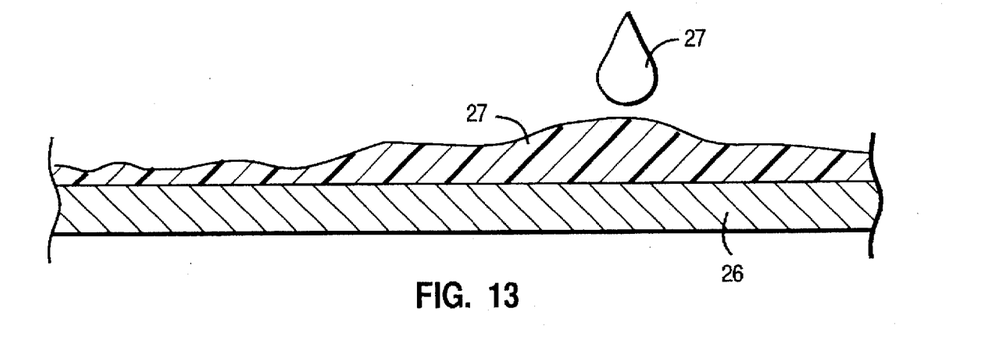
FIGS. 13–20 depict by schematic cross-section the various stages in the formation of a circuit board capacitor structure.

The fabrication process of the capacitor structure board layer begins as illustrated in FIG. 13 with the coating of a conductive metallic sheet 26, analogous to CIC sheet 1, with a solution-sol-gel (sol-gel) compound 27. Sheet 26 is preferably platinum plated invar, or copper-invar-copper covered by a flash coating of platinum to eliminate copper oxidation and reaction with the sol-gel compound. Sol-gel compound 27 is spin coated, sprayed, dipped or otherwise deposited onto the surface to a nominal thickness of approximately 0.001 millimeter. A variety of materials can be used for compound 27, an example being lead-lanthanum-titanate as described in IBM Research Report RC 19550 (84975) Apr. 25, 1994, entitled "Thickness Dependent Dielectric Properties of Sol-Gel Prepared Lead Lanthanum Titanate Films" by authors Beach et al, as published by the IBM Research Division, T. J. Watson Research Center, the subject matter of which is incorporated by reference herein. The fundamental concepts underlying the sol-gel process are described in two articles published in the technical journal *Advanced Materials*. The first is entitled "Advanced Dielectrics: Bulk Ceramics and Thin Films" by authors Hennings et al, as appear in *Advanced Materials* 3 (1991), No. 7/8, on pages 334–340. The second article is entitled "Sol-Gel Processes" by Reuter, as appeared in *Advanced Materials* 3 (1991), No. 5, pages 258–259. The subject matter of both references is incorporated by reference herein.

Figure 14:
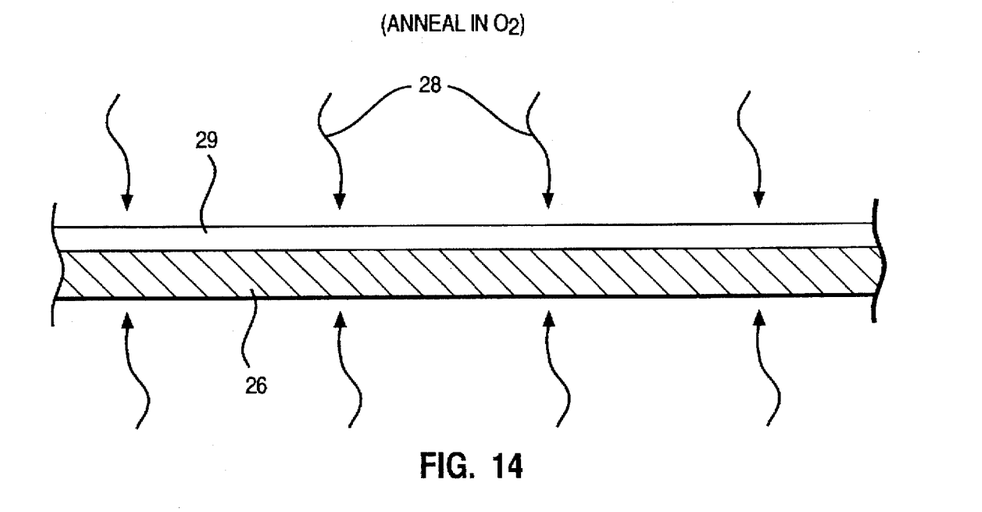

The next step in the sol-gel process is depicted generally in FIG. 14, comprising a high oxygen environment thermal anneal involving temperatures nominally approaching 700 degrees C. The goal is to form a thin crystalline film layer 29 on metallic sheet 26, which layer 29 is characterized by a low leakage current and an extremely high dielectric constant, typically in the range of 500. One skilled in physics will immediately appreciate a number of factors associated with dielectric layer 29. First, since the value of capacitance is inversely proportional to the thickness of the dielectric, the thin film character of dielectric layer 29 provides a structure of high capacitance per unit area. The high capacitance also benefits from the fact that capacitance is directly proportional to the area, which now extends substantially over the full surface of the stackable circuit board layer. Lastly, since capacitance is directly proportional to the dielectric constant, the exceptionally high dielectric constant of the sol-gel formed crystalline thin film materials further accentuates the capacitance obtainable.

It should not be overlooked that the high temperatures required of the sol-gel process to form the crystalline thin films such as 29 are outside the realm of capability for convention printed circuit board compositions such as FR4. Such printed circuit board materials have a glass transition temperature in the range of 120° to 180° C. In contrast, the thermal anneal temperature of the sol-gel is suitable for metal sheet core structures such as 26, when the oxidation and reaction characteristics of the selected metal are consistent with the thermal environment.

Figure 15:
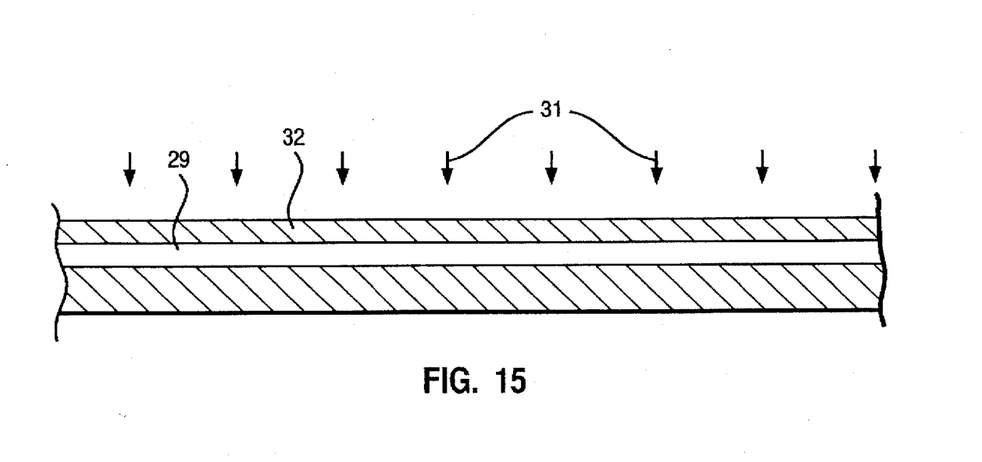

Following the sol-gel process formation of crystalline thin film layer 29, layer 29 has deposited thereon by chemical vapor deposition, sputtering, evaporation, or plating, generally 31, a several micron thick layer of electrically conductive material 32, as schematically depicted in FIG. 15. The concluding three-layer capacitive structure in FIG. 15 then serves as the core sheet for a board layer fabrication process analogous to that described beginning with FIG. 1.

Figure 16:
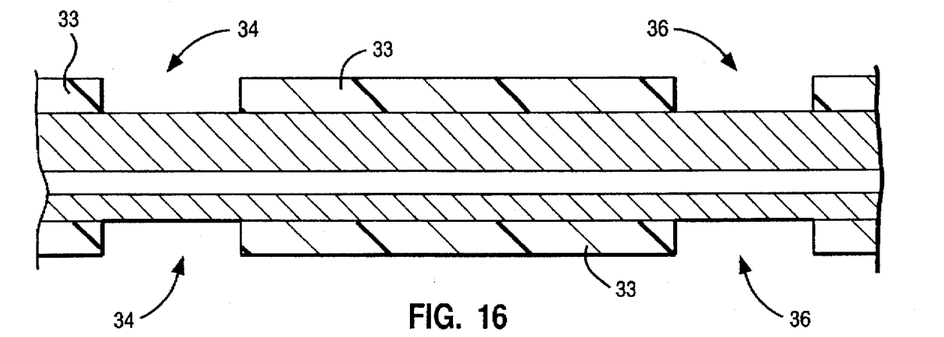
Figure 17:
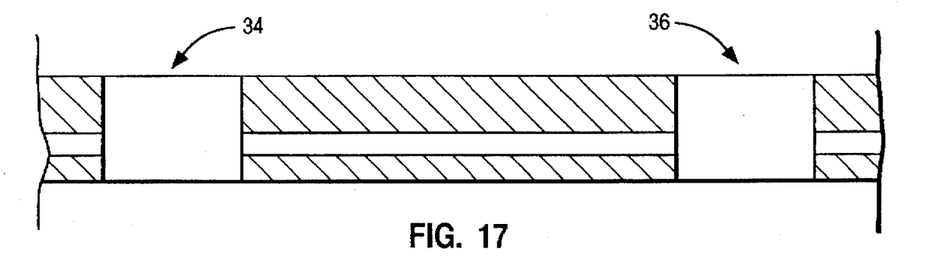

The capacitor board layer pattern formation begins with the operations which produce the cross-section depicted in FIG. 16. As shown, capacitive core sheet is selectively covered by a photolithographically processed mask 33 so as to provide openings 34 and 36. Openings 34 and 36 are preferably circular in shape. Etching of the capacitor core sheet follows, preferably employing an anisotropic etchant such as cupric chloride and hydrochloric acid. Upon the conclusion of the etch and a strip of mask 33, the core sheet appears as shown in FIG. 17 with holes at selected locations 34 and 36.

Figure 18:
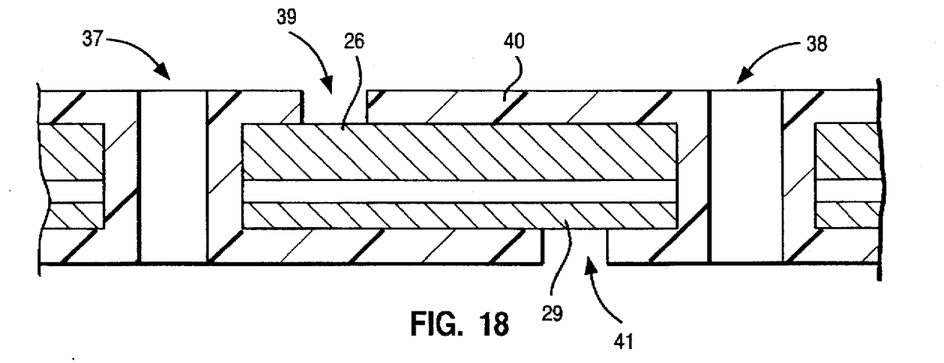

Next, a dielectric such as 6 in FIG. 3 is formed over the core sheet. A selective removal of dielectric 6 by photolithographic masking and selective etching forms a dielectrically insulated via hole at 37, a dielectrically insulated via hole at 38, an exposed contact opening at 39 to metallic layer 26 of the capacitive core, and an opening 41 through dielectric 40 to the other metallic layer 29 of the capacitive core. Processing analogous to that described with reference to FIGS. 5, 6 and 7 follows, thereby producing the structure in FIG. 18. The processes include the formation of a thin copper commoning layer, the formation of a mask, and a plating to form a thick metallic layer through the vias at 37 and 38 and into the respective openings at 39 and 41, the latter formations being electrically common to effective capacitor plates 26 and 29. After the strip of the mask, the capacitor layer circuit board structure appears as shown in the cross-section of FIG. 19.

Figure 19:
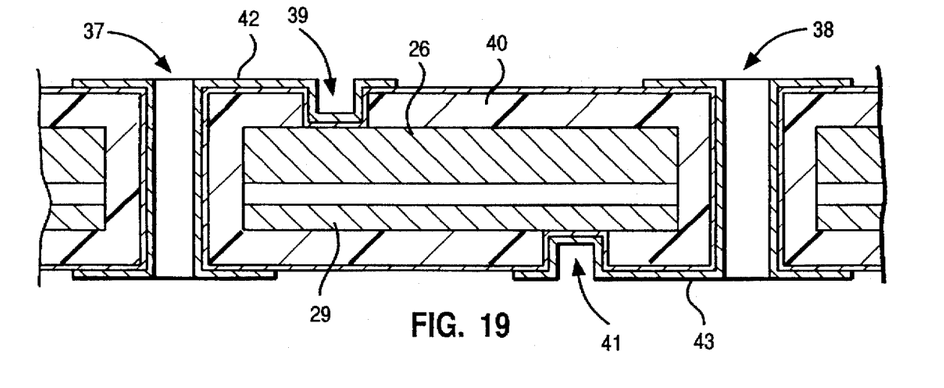

Note that plated conductive layer 42 extends through the opening at 37 to the other side of the board from a contact to conductive plate 26 of the capacitor structure at opening 39 in dielectric 40. Similarly, plated metallic layer 43 extends through the opening at 38 and is electrically connected to capacitor plate 29 through the contact opening at 41.

Figure 20:
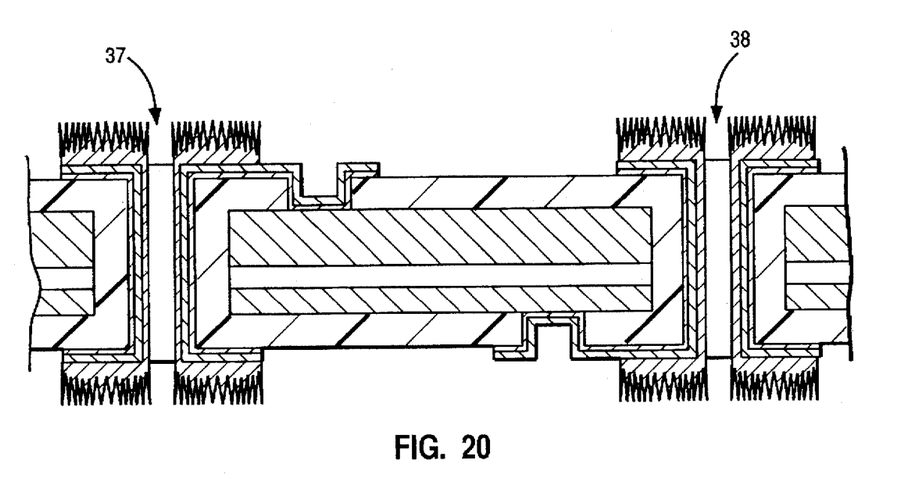

A photolithographic masking and dendrite formation operation, analogous to that described with reference to FIGS. 8, 9 and 10, produces the capacitive circuit board layer structure depicted in FIG. 20. Note that the dendrite covered via at 37 is common to one plate of the capacitor structure while the dendrite covered via at 38 is common to the opposite plate of the capacitor structure.

Figure 21:
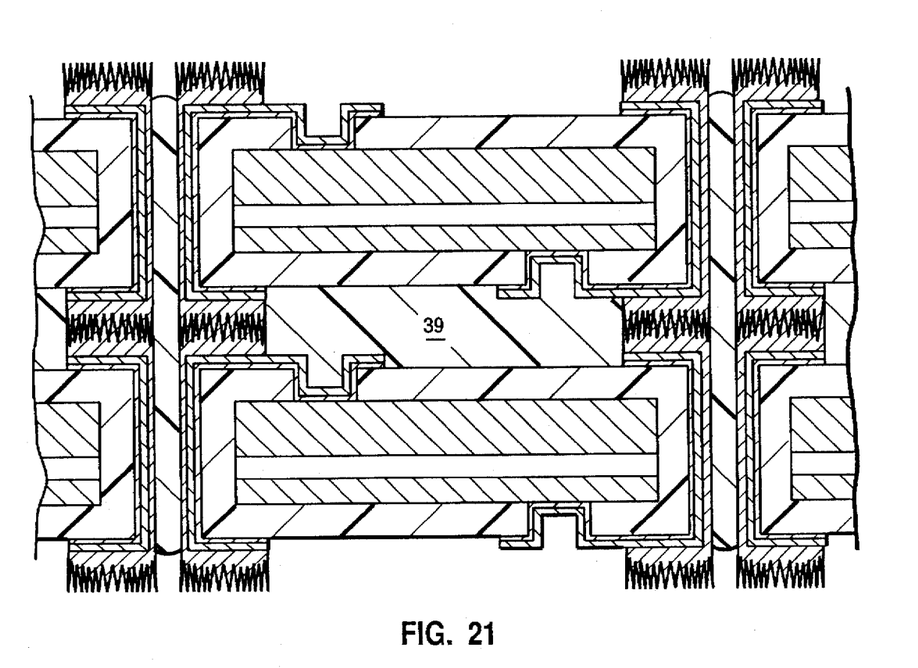
FIG. 21 depicts by schematic cross-section the laminar interconnection of two circuit board capacitor layers.

A parallel connection of multiple capacitor layers produces the structure in FIG. 21. A viscous dielectric 39 is used in the manner described with reference to FIG. 12, to seal and bind the two mated circuit board layers. Again, the use of heat during the lamination step reflows the joining metallurgy on the via dendrites to form a high integrity electrical connection.

What is noteworthy about the composite in FIG. 21 is the ease with which circuit board capacitive structures are connected in parallel, and in such form are available for further interconnection to successive signal and power distribution layers from either below or above. Foremost, note that the manufacturing processes used to create the capacitive layers are similar to those practiced to create the signal and power distribution circuit board layers.

Figure 22:
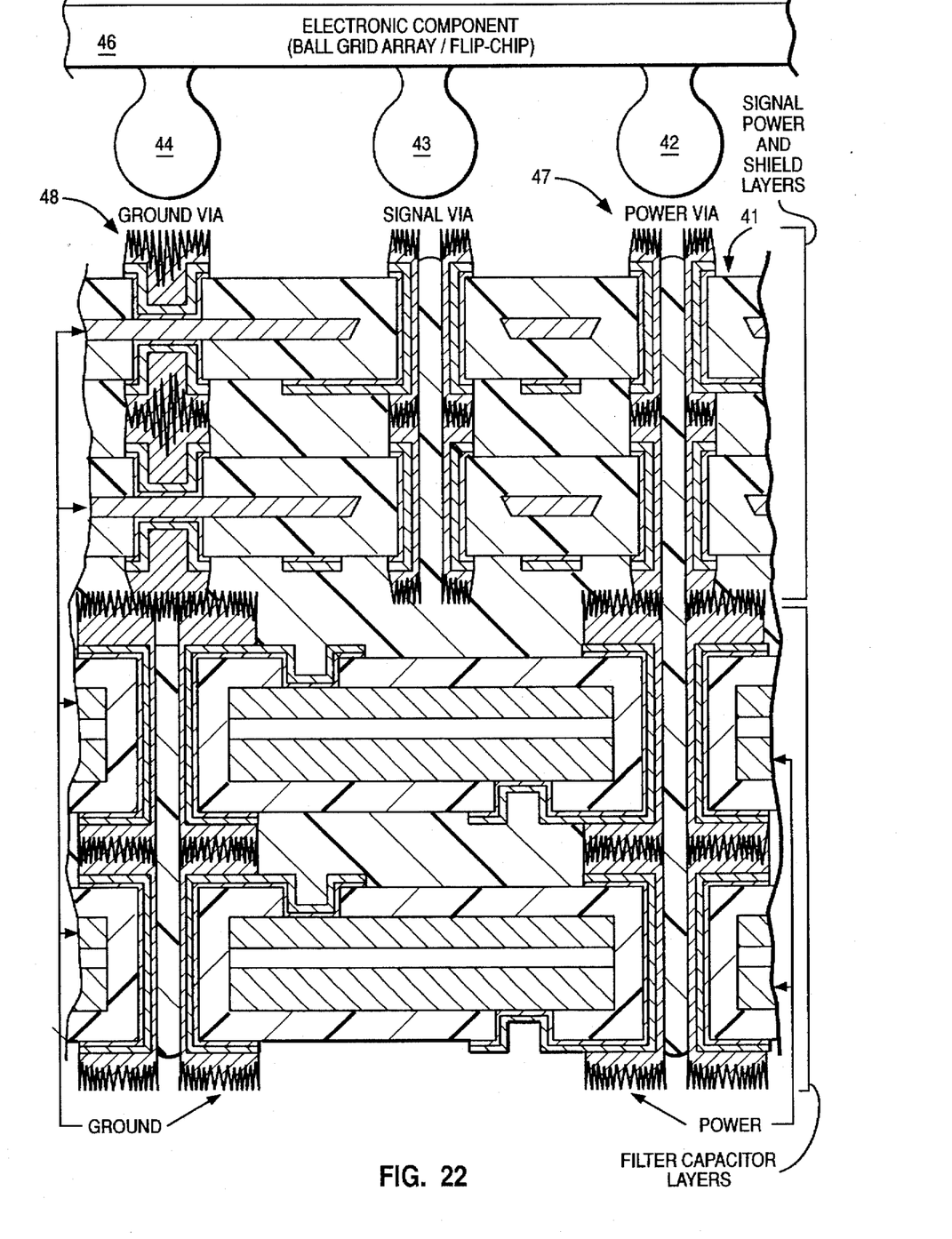
FIG. 22 depicts by schematic cross-section the use of a four layer laminar stackable circuit board structure to convey ground, power, and signals to a flip-chip type electronic component, the composite structure including signal layers, power supply layers, and capacitive layers, interconnected through successive via and plug structures.

The third aspect of the invention deals with the ability to interconnect the circuit board layers which distribute the electric power and electrical signals with the layers which provide capacitive decoupling in a laminar stackable multilayer circuit board configuration. An example is shown in FIG. 22. As depicted in the figure, the composite structure has the two capacitor layers of FIG. 21 situated at the bottom of the structure in FIG. 22, and two layers of FIG. 12, which distribute the electrical signals, distribute the electrical power and provide shielding, laminated above. In the furtherance of distributing the capacitance, it likely that arrays of vias may be used to interconnect capacitive board layers without being used for further direct interconnection as component power supply and ground lines. For purposes of illustration, laminar stackable multilayer circuit board 41 is shown in anticipation of a further connection to balls 42, 43 and 44 of a ball-grid array type flip-chip electronic component 46. Note in particular that the power supply via at 47 and the ground via at 48 are situated in immediate vertical alignment with the respective balls 42 and 44. This minimizes any resistive and inductive effects which might reduce the decoupling provided by the underlying capacitive layers of the multilayer board structure. Similarly, note that electronic component ball 43 receives signals from the multilayer board connections directly below. This arrangement reduces the length of the signal path as well as any resistance or inductance in the signal path.

Though the invention has been described and illustrated by way of specific embodiments, the apparatus and methods encompassed by the invention should be interpreted to be in keeping with the breadth of the claims set forth hereinafter.

We claim:

1. A circuit board capacitor, comprising:
   an electrically conductive first power plane;
   a first dielectric layer of uniform thin film high dielectric composition formed directly on one surface of the first power plane;
   an electrically conductive second power plane extending over the first dielectric layer, the first power plane, first dielectric layer and second power plane forming a capacitor thereby;
   a first via extending through the first power plane, the second power plane and the first dielectric layer, electrically connected by a contact to a planar surface of the second power plane and electrically insulated from the first power plane by a relatively thick second dielectric layer; and
   a second via extending through the first power plane, the second power plane and the first dielectric layer, electrically connected by a contact to a planar surface of the first power plane and electrically insulated from the second power plane by the relatively thick second dielectric layer.

2. The apparatus recited in claim 1, wherein the first and second vias have dendrites at ends of the vias.

3. The apparatus recited in claim 1, wherein the first dielectric layer is a high dielectric constant crystalline thin film.

4. The apparatus recited in claim 2, wherein the first dielectric layer is a high dielectric constant crystalline thin film and the dendrites include a joining metallurgy.

5. The apparatus recited in claim 3, wherein the second dielectric is a photolithographically patterned formation.

6. The apparatus recited in claim 4, wherein the second dielectric is a photolithographically patterned formation.

7. The apparatus recited in claim 1, further comprising:
   an electrically conductive third power plane;
   an electrically conductive fourth power plane;
   a thin film third dielectric layer between the third and fourth power planes;
   a third via extending through the third power plane, the fourth power plane and the third dielectric layer, electrically connected to the fourth power plane and electrically insulated from the third power plane by a fourth dielectric layer;
   a fourth via extending through the third power plane, the fourth power plane and the third dielectric layer, electrically connected to the third power plane and electrically insulated from the fourth power plane by the fourth dielectric layer; and
   direct connection between the first and third vias and between the second and fourth vias.

8. The apparatus recited in claim 7, wherein the third and fourth vias have dendrites at the ends of the vias.

9. The apparatus recited in claim 7, wherein the third dielectric layer is a high dielectric constant crystalline thin film.

10. The apparatus recited in claim 8, wherein the third dielectric layer is a high dielectric constant crystalline thin film and the dendrites include a joining metallurgy.

11. The apparatus recited in claim 8, wherein the direct connection comprises physical bonding of via dendrite joining metallurgy.

12. A circuit board including capacitor elements, comprising:
   an electrically conductive first power plane;
   a first dielectric layer of uniform thin film high dielectric composition formed directly on one surface of the first power plane;
   an electrically conductive second power plane extending over the first dielectric layer, the first power plane, first dielectric layer and second power plane forming a capacitor thereby;
   a first via extending through the first power plane, the second power plane and the first dielectric layer, electrically connected by a contact to a planar surface of the second power plane and electrically insulated from the first power plane by a relatively thick second dielectric layer;

a second via extending through the first power plane, the second power plane and the first dielectric layer, electrically connected by a contact to a planar surface of the first power plane and electrically insulated from the second power plane by the relatively thick second dielectric layer;

an electrically conductive third power plane;

a relatively thick third dielectric over the conductive third power plane;

a third via extending through the third dielectric and either side of the third power plane, electrically connected to a region of the third power plane;

a fourth via extending through the third power plane and electrically insulated from the third power plane by the relatively thick third dielectric;

direct connection between the first and the third or fourth vias; and direct connection between the second and the third or fourth vias.

13. The apparatus recited in claim 12, wherein the vias have dendrites at the ends of the vias.

14. The apparatus recited in claim 12, wherein the first dielectric layer is a high dielectric constant crystalline thin film.

15. The apparatus recited in claim 13, wherein the first dielectric layer is a high dielectric constant crystalline thin film and the dendrites include a joining metallurgy.

16. A circuit board capacitor, comprising:

a copper-invar-copper sheet first power plane;

a thin crystalline high dielectric film layer of uniform composition formed by sol-gel processing directly on one surface of the copper-invar-copper sheet first power plane;

an electrically conductive second power plane, materially thinner than the first power plane and extending as a directly formed layer over the dielectric film layer, the first power plane, dielectric film layer and second power plane forming a capacitor thereby;

a first via layer of plated electrical conductor extending through the first power plane, the second power plane and the dielectric film layer, electrically connected by a contact to a planar surface of the second power plane, and electrically insulated from the first power plane by walls of second dielectric layer photolithographically defined in holes extending through the first power plane;

a second via layer of plated electrical conductor extending through the first power plane, the second power plane and the dielectric film layer, electrically connected by a contact to a planar surface of the first power plane, and electrically insulated from the second power plane by walls of second dielectric layer photolithographically defined in holes extending through the second power plane; and plated dendrites on the via layer, proximate the extension of via layer through the holes in the first and the second power planes.

17. The apparatus recited in claim 16, wherein the dendrites include a joining metallurgy.

* * * * *